(12) United States Patent
Jang (10) Patent No.: US 11,328,771 B2
(45) Date of Patent: May 10, 2022

(54) SENSE AMPLIFIER CIRCUIT FOR PREVENTING READ DISTURB

(71) Applicant: Integrated Silicon Solution, (Cayman) Inc., Grand Cayman (KY)

(72) Inventor: Seong-Jun Jang, Danville, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 17/143,112

(22) Filed: Jan. 6, 2021

(65) Prior Publication Data

US 2022/0084590 A1 Mar. 17, 2022

Related U.S. Application Data

(63) Continuation of application No. 63/078,762, filed on Sep. 15, 2020.

(51) Int. Cl.
*G11C 7/00* (2006.01)
*G11C 13/00* (2006.01)
*G11C 11/16* (2006.01)

(52) U.S. Cl.
CPC ...... *G11C 13/0033* (2013.01); *G11C 11/1673* (2013.01); *G11C 13/004* (2013.01)

(58) Field of Classification Search
CPC ............ G11C 13/0033; G11C 11/1673; G11C 13/004; G11C 11/1655; G11C 3/0026; G11C 7/065; G11C 7/08; G11C 7/12; G11C 2013/005
See application file for complete search history.

(56) References Cited

U.S. PATENT DOCUMENTS

| 6,476,645 | B1 * | 11/2002 | Barnes | G11C 7/065 327/212 |
|---|---|---|---|---|
| 2004/0130353 | A1 * | 7/2004 | Nautiyal | G11C 7/02 327/55 |
| 2005/0116222 | A1 * | 6/2005 | Chou | G11C 29/006 257/48 |
| 2020/0105315 | A1 * | 4/2020 | Chang | G11C 7/08 |

* cited by examiner

*Primary Examiner* — Hien N Nguyen (57) ABSTRACT

A sense amplifier circuit implements a sense scheme using sense amplifier feedback control to disconnect the bit lines from the sense circuit during the read operation after the bit line signals are sensed. In this manner, read disturbance during the read operation is prevented. In some embodiments, the sense amplifier circuit includes a pair of pass gates to couple a pair of differential bit lines to a sense circuit. The sense amplifier circuit further includes a feedback control circuit to open the pair of pass gates in response to at least one of the sensed signals at the sense circuit changing logical state. The pair of pass gates are opened to disconnect the pair of differential bit lines from the sense circuit.

13 Claims, 9 Drawing Sheets

SENSE AMPLIFIER CIRCUIT FOR PREVENTING READ DISTURB

CROSS REFERENCE TO RELATED APPLICATIONS

This application claims priority to U.S. Provisional Patent Application No. 63/078,762, entitled SENSE AMPLIFIER CIRCUIT FOR PREVENTING READ DISTURB, filed Sep. 15, 2020, which is incorporated herein by reference for all purposes.

FIELD OF THE INVENTION

The invention relates to sense amplifier circuit for a memory device, and, in particular, to a sense amplifier circuit for preventing read disturb of memory cells in a memory device.

BACKGROUND OF THE INVENTION

At present, emerging memories such as ReRAM (resistive random-access memory), MRAM (magnetic random-access memory) and PRAM (parameter RAM) have shortcomings at read and write operations. In particular, MRAM memory devices has shortcomings including write failure at high write current and read disturbance at high read current. These shortcomings impact the key factors of the memory device, such as memory endurance. Read disturbance occurs during read operation of a selected memory cell and is a particular problem for MRAM devices, such as those using a magnetic tunnel junction (MTJ). If the read current is too high and reaches the write current level, a memory cell in the MRAM device maybe over-written with the wrong data instead of maintaining the same data during the read operation of another memory cell. To avoid read disturbance, the memory device needs to control the read current and voltage precisely, which often requires precise and complicated signal controls. The read control circuit creates signal delay and reduces the performance of the memory device, such as the cycle time. Solutions to avoid or minimize the read disturb impact while maintaining the performance level of the memory device without the complexity of control circuit are desired.

BRIEF DESCRIPTION OF THE DRAWINGS

Various embodiments of the invention are disclosed in the following detailed description and the accompanying drawings.

FIG. 1, which includes

DETAILED DESCRIPTION

In embodiments of the present disclosure, a sense amplifier circuit implements a sense scheme using sense amplifier feedback control to disconnect the bit lines from the sense circuit during the read operation after the bit line signals are sensed. In this manner, the sense amplifier circuit implementing the sense scheme reduces or prevents occurrences of read disturbance in the memory device when accessing one memory cell may lead to another memory cell being over-written. The sense amplifier circuit of the present disclosure is able to minimize or prevent read disturbance during read operation while maintaining read performance, without the need for complicated signal control.

In some embodiments, the sense scheme operates by keeping the sense amplifier input path connected to the bit lines during a read operation until the sense amplifier develops the sense amplifier output signal. A sense amplifier feedback control circuit detects the sense amplifier output signal, or a signal related to the sense amplifier output signal, and generates a control signal which is fed back to the sense amplifier circuit to shut off the sense amplifier input path. In this manner, the bit lines are disconnected from the sense amplifier circuit and read disturbance to memory cells coupled to the bit lines is prevent. In particular, the high voltage and current that may be developed at the sense amplifier circuit for the purpose of reading the stored data from a memory cell would not be presented to the bit lines for a sufficient time to over-write the memory cell.

The sense amplifier circuit and sense scheme of the present disclosure can be applied to any memory circuits for preventing read disturb during read operations. The sense amplifier circuit and sense scheme are particularly advantageous when applied in emerging memories, such as MRAM or ReRAM, that are sensitive to high voltage on the bit lines during read operations.

Figure 1A:
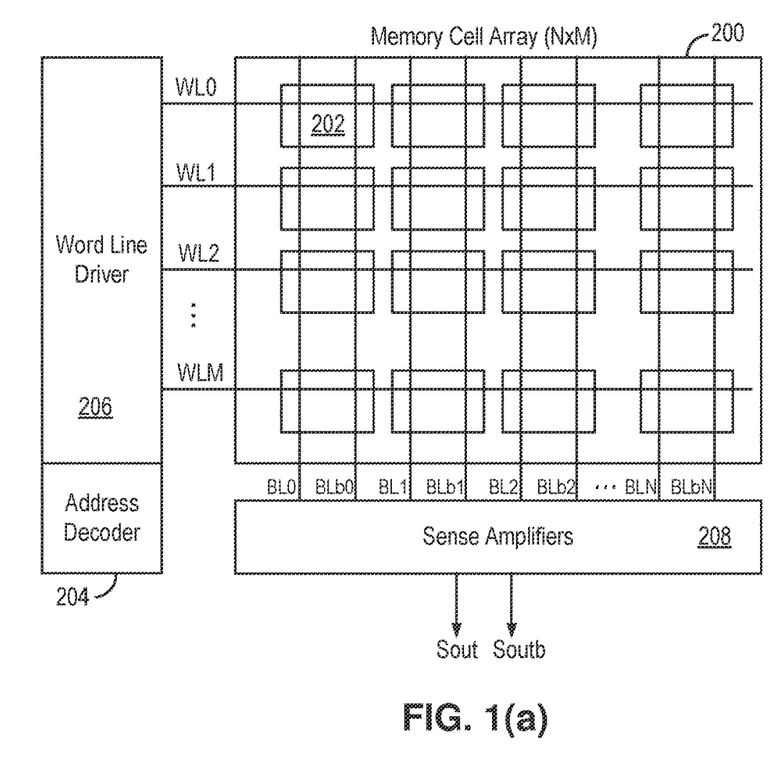
FIGS. 1(a) and 1(b), illustrates a semiconductor memory circuit and a sense amplifier circuit in examples of the present disclosure.
Figure 1B:
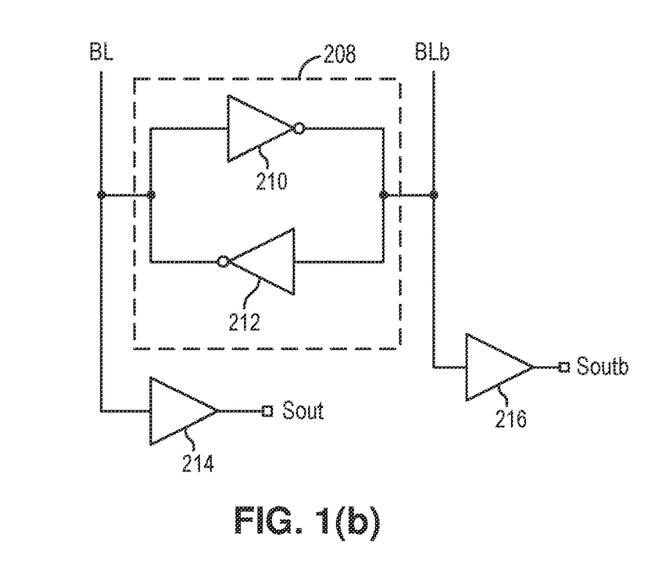

FIG. 1, which includes FIGS. 1(a) and 1(b), illustrates a semiconductor memory circuit and a sense amplifier circuit in examples of the present disclosure. Referring to FIG. 1(a), a semiconductor memory circuit includes memory cells arranged in an array, such as a two-dimensional array 200. Each memory cell 20 in the array 200 is coupled to a word line WL and a pair of differential bit lines BL and BLb, as well as a power and ground connection. To read or write data from or to a selected memory cell, an address is provided to the address decoder 204 to select a memory cell. Word line drivers 206 drives the selected word line to access the selected memory cell. Sense amplifiers 208 amplifies the signals that are read from the selected memory cell and provides sense amplifier output signals Sout and Soutb as the read out signals. It is instructive to note that FIG. 1(a) illustrates only some elements of a semiconductor memory circuit to simply the discussion. In practice, a semiconductor memory circuit includes other circuit elements, such as buffers, write data drivers and precharge circuit, to complete the memory circuit. FIG. 1(a) is representative only and is not intended to be limiting.

In the present example, the memory cell 202 is connected to a pair of differential bit lines BL and BLb. The bit line BL carries the bit line signal and the bit line BLb carries the complement of the bit line signal. In some memory circuits, such as MRAM memory devices, the memory cell current is very small and therefore the sense amplifier is implemented for current sensing. FIG. 1(b) illustrates a sense amplifier circuit in some examples. Referring to FIG. 1(b), a sense amplifier circuit 208 implemented for current sensing includes a pair of cross-coupled inverters 210 and 212. The inverters 210, 212 are coupled to respective bit line BL and bit line BLb and both receive a bit line signal from one bit line while driving the other bit line with an inverted bit line signal. During read operation of a selected memory cell, a bit line signal develops on the bit line BL or BLb in response to the memory cell current associated with the stored data. The sense amplifier 208 senses the bit line signals on the differential bit lines BL, BLb and amplifies the differential bit line signals back onto the differential bit lines. The sensed signal on the bit line BL is coupled to an output circuit 214 to generate the sense amplifier output signal Sout. The sensed signal on the bit line BLb is coupled to an output circuit 216 to generate the complement sense amplifier output signal Soutb.

Emerging memories such as MRAM and ReRAM have shortcomings at read and write operation. One shortcoming of emerging memories is disturbance during the read operation which can flip the stored data of another memory cell because of long or high read current, or high voltage across the selected memory cell. The conventional current sensing scheme, such as the sensing scheme shown in FIG. 1(b), is not effective in avoiding read disturbance. Some solutions to the read disturb problem leads to the use of complicated circuit requiring precision timing control, which can impact memory circuit performance and lead to yield loss.

As will be described in more detail below, in embodiments of the present disclosure, a sense amplifier circuit implements a self-timed feedback control scheme to prevent read disturbance without negative impact on device performance or production yield. The sense amplifier circuit of the present disclosure can be applied to a wide array of memory circuits, but is particularly advantageous when applied to non-volatile memory designs that are susceptible to read disturbance issues. For example, memory circuits using high voltage for write operation and low voltage for read operations may be susceptible to read disturb when the bit line voltages become too high during the read operation. The sense amplifier circuit of the present disclosure can be applied to prevent read disturbance while improving read endurance and stability for all types of memory devices.

Figure 2:
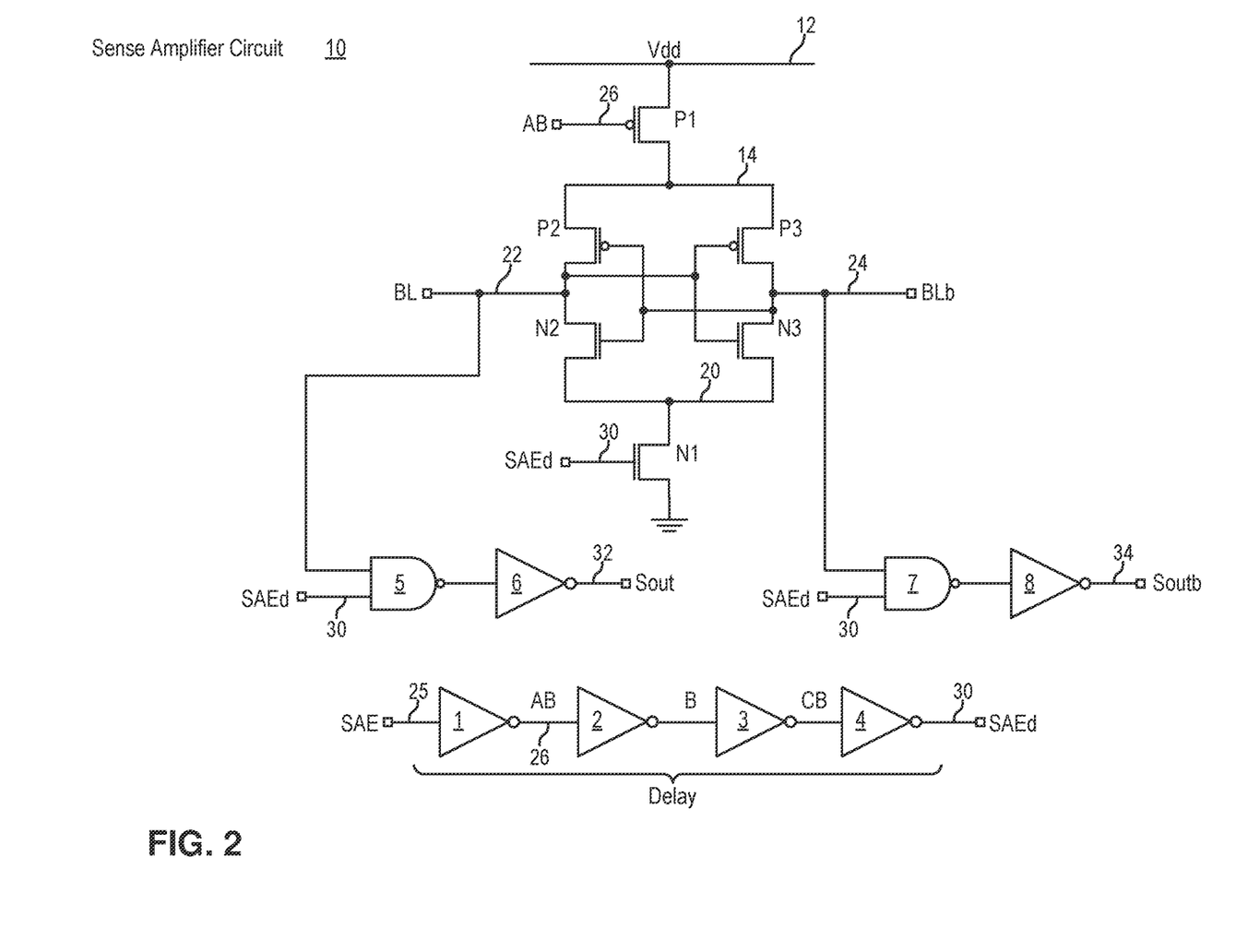
FIG. 2 illustrates a sense amplifier circuit configured for current sensing in some examples.
Figure 3:
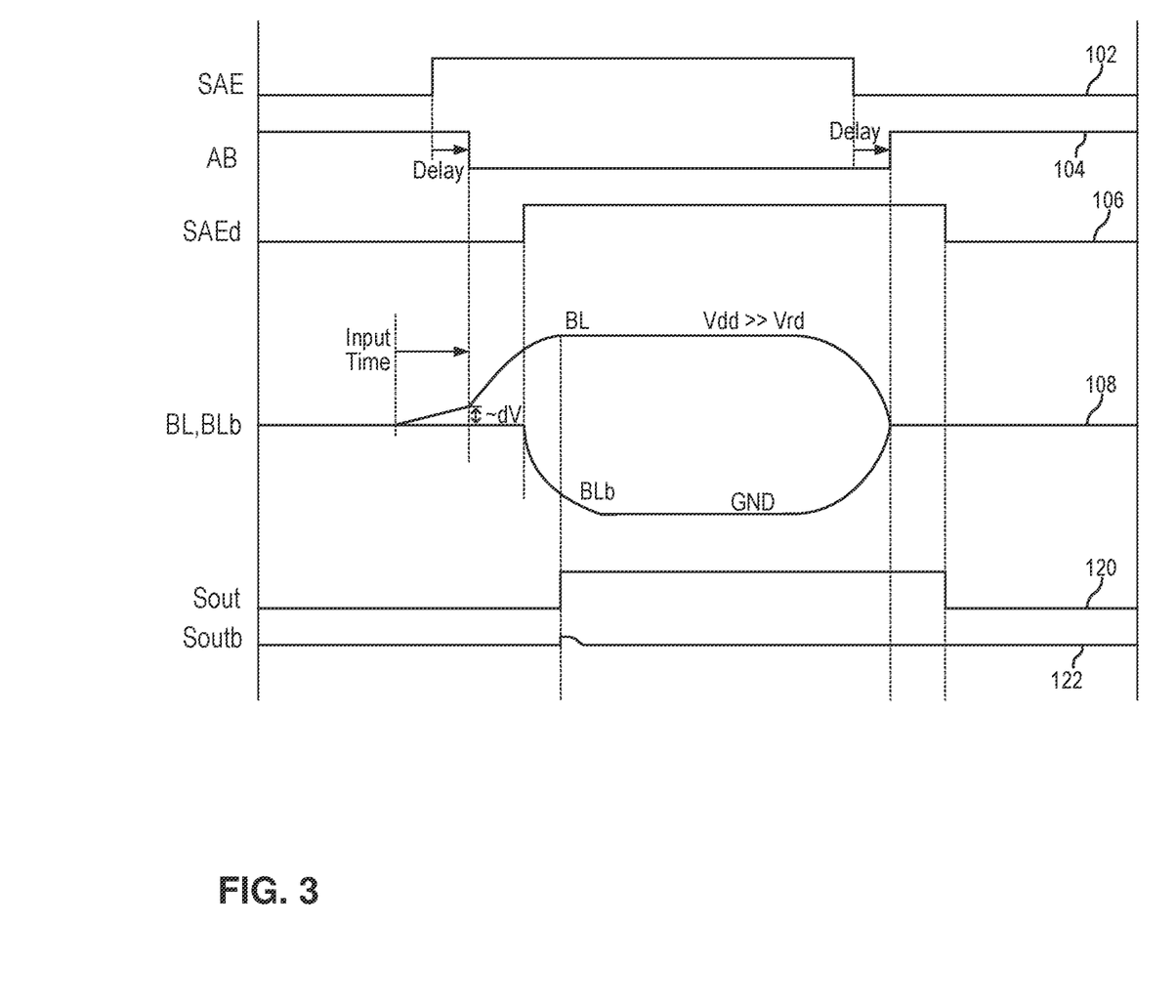
FIG. 3 is a timing diagram illustrating the operation of the sense amplifier circuit of FIG. 2 in some examples.

FIG. 2 illustrates a sense amplifier circuit configured for current sensing in some examples. FIG. 3 is a timing diagram illustrating the operation of the sense amplifier circuit of FIG. 2 in some examples. Referring to FIG. 2, a sense amplifier circuit 10 implementing current sensing for a pair of differential bit lines BL (node 22) and BLb (node 24) uses a pair of cross-coupled inverters formed by PMOS transistor P2 and NMOS transistor N2, forming a first inverter, and PMOS transistor P3 and NMOS transistor N3, forming a second inverter. The sense amplifier circuit 10 is enabled by a sense amplifier enable signal SAE (node 25) which may be buffered by a chain of inverters 1-4. An inverted sense amplifier enable signal AB (node 26) is coupled to control a PMOS transistor P1 connected between the power supply voltage Vdd (node 12) and a node 14. A non-inverted sense amplifier enable signal SAEd (node 30) is coupled to control a CMOS transistor N1 connected between a node 20 and the ground potential. In the present illustration, the sense amplifier enable signal SAEd is a delayed version of the sense amplifier enable signal SAE.

The sense amplifier circuit 10 includes output circuits to generate the sense amplifier output signals in response to the sensed signals at the cross-coupled inverters. For example, a first output circuit includes a NAND gate 5 connected to an inverter 6. The NAND gate 5 is coupled to node 22 to receive the sensed signal from the cross-coupled inverters and is further coupled to node 30 to receive the enable signal SAEd. When activated by the enable signal SAEd, the NAND gate 5 pass the logical state of the sensed signal on node 22 to the inverter 6 and inverter 6 generates the sense amplifier output signal Sout (node 32). A second output circuit includes a NAND gate 7 connected to an inverter 8. The NAND gate 7 is coupled to node 24 to receive the sensed signal from the cross-coupled inverters and is further coupled to node 30 to receive the enable signal SAEd. When activated by the enable signal SAEd, the NAND gate 7 pass the logical state of the sensed signal on node 24 to the inverter 8 and inverter 8 generates the sense amplifier output signal Soutb (node 32). Sense amplifier output signal Soutb is a complement of the sense amplifier output signal Sout.

Referring to FIG. 3, during a read operation, a memory cell is selected and cell current flows in the differential bit lines BL and BLb associated with the selected memory cell. The differential bit lines BL and BLb (curve 108) coupled to the selected memory cell develop bit line voltages indicative of the stored memory data. The sense amplifier enable signal SAE (curve 102) is asserted (logical "H") to enable the sense amplifier circuit. After a given delay, the enable signals AB (curve 104) and SAEd (curve 106) turns on transistors P1 and N1 and activates the sensing of the bit lines at the sense amplifier using the cross-coupled inverters (P2, N2, P3, N3). In the present example, it is assumed that the stored data is a logical "1". In that case, as sensing starts, the sense amplifier senses the current flowing on the differential bit lines and detects the voltage differential between bit line BL and bit line BLb. When the voltage differential is large enough, the sense amplifier will drive the bit lines to the respective logical state ("1" or "0"). Accordingly, bit line BL is driven to the positive power supply voltage Vdd and bit line BLb is driven to the ground potential. The output circuits then generate the sense amplifier output signal Sout (curve 120) and Soutb (curve 122).

In the sensing scheme shown in FIG. 2, the sense amplifier output signal is fed back, or driven back onto the bit lines BL and BLb. The result is that the bit line voltage can be driven to a high level (e.g. Vdd), such as a voltage level greater than the read disturb voltage Vrd. Furthermore, in some cases, the read operation may cause the high read current or high read voltage to be held for a long duration. Holding the bit line BL or BLb at a high voltage level, or at high current level or for a long duration may result in over-writing or flipping of the stored data in some of the memory cells connected to the bit lines. This is referred to as the read disturbance issue in memory circuits. Read disturbance causes stored memory data of some memory cells to flip because of long or high read current, high voltage on the bit lines being applied across the memory cells. To prevent the read disturbance issues, the read voltage and read current during the read operation should be kept low, or lower than the write voltage and write current.

Figure 4:
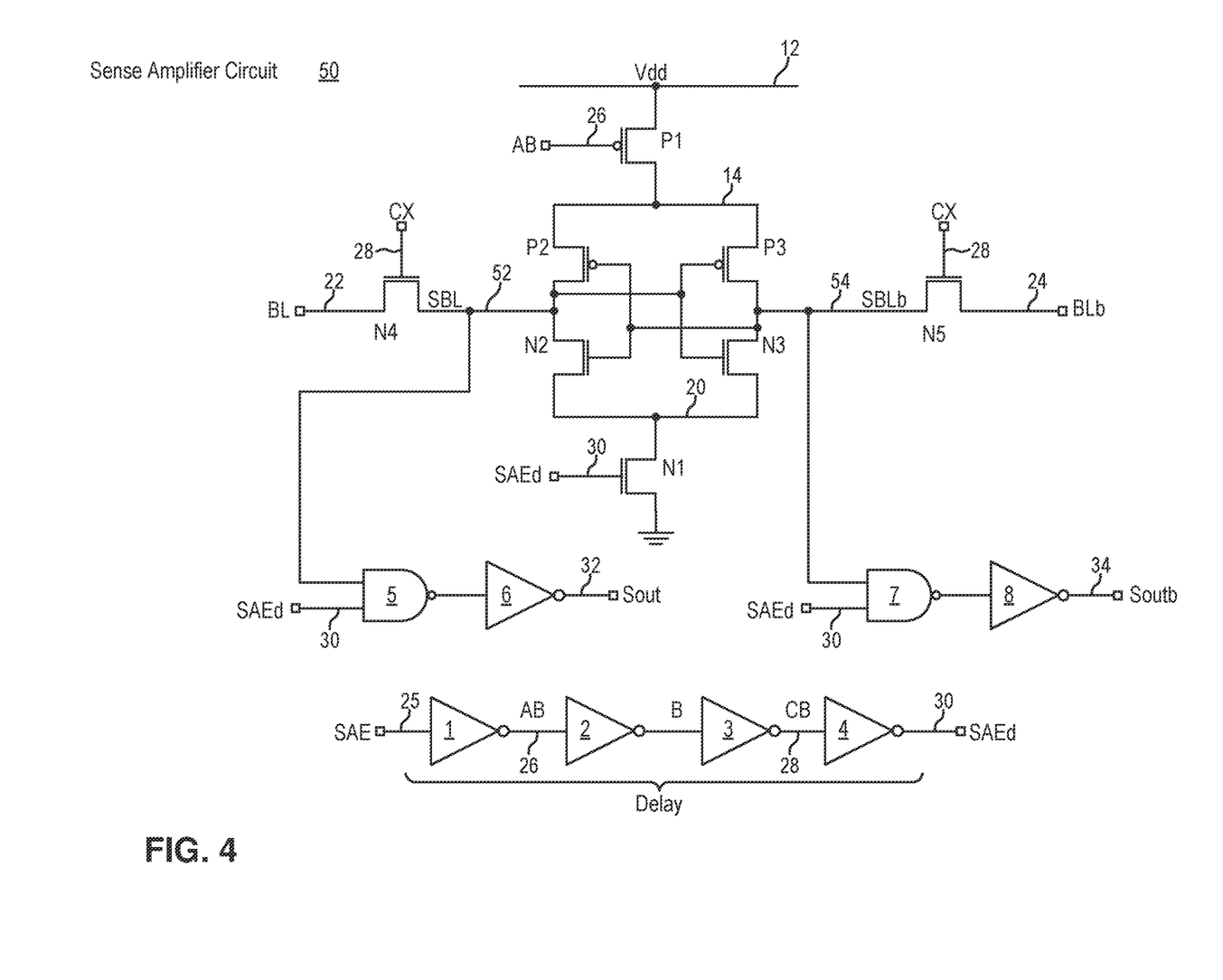
FIG. 4 illustrates a sense amplifier circuit configured for current sensing in some examples.
Figure 5:
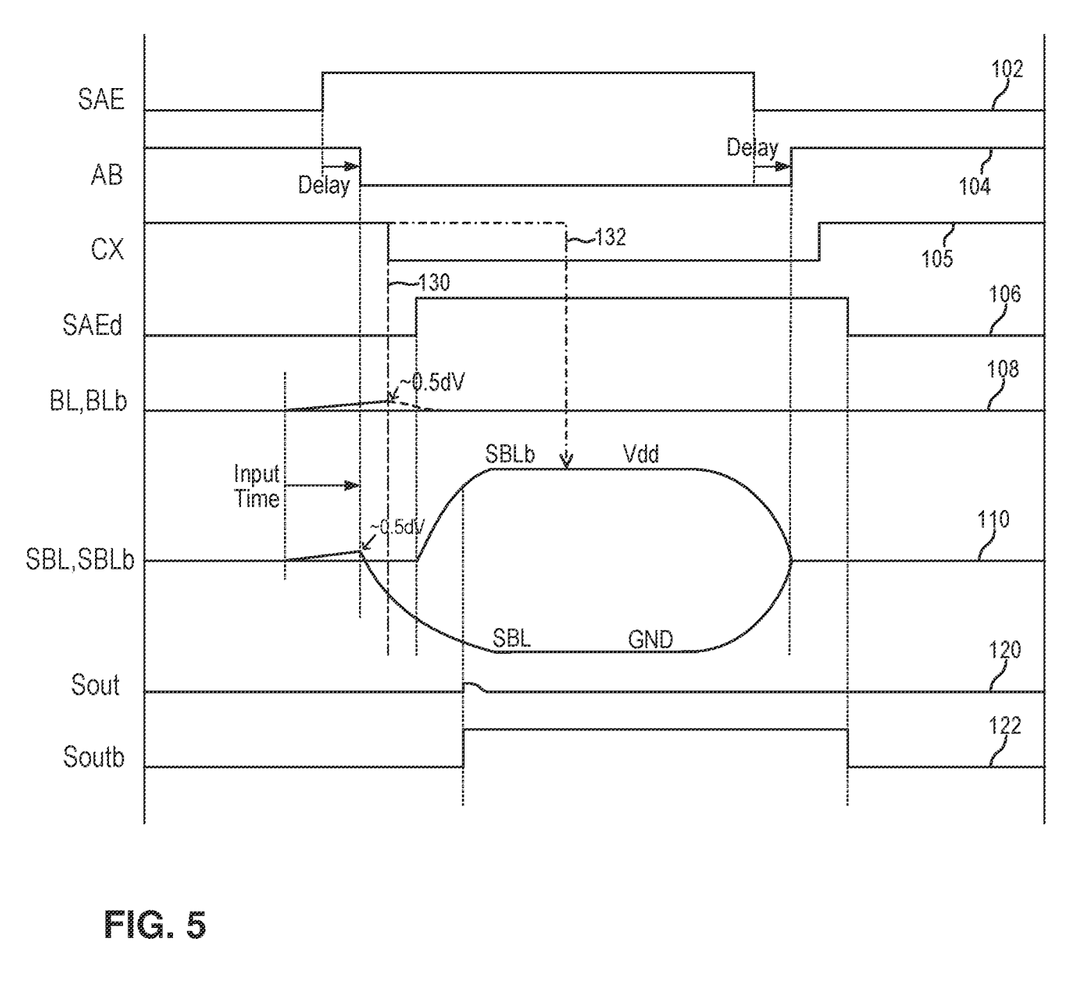
FIG. 5 is a timing diagram illustrating the operation of the sense amplifier circuit of FIG. 4 in some examples.

FIG. 4 illustrates a sense amplifier circuit configured for current sensing in some examples. FIG. 5 is a timing diagram illustrating the operation of the sense amplifier circuit of FIG. 4 in some examples. Like elements in FIGS.

2 to 5 are given like reference numerals to simplify the discussion. Referring to FIG. 4, a sense amplifier circuit 50 implements measures to address the read disturb condition. In particular, the sense amplifier circuit 50 incorporates pass gates N4 and N5 to isolate the bit lines BL and BLb from the sensing input of the sense amplifier circuit. For instance, the pass gate N4 is coupled between bit line BL (node 22) and a first terminal 52 of the sense circuit in the sense amplifier circuit 50; and the pass gate N5 is coupled between bit line BLb (node 24) and a second terminal 54 of the sense circuit in the sense amplifier circuit 50. In the present description, the sense circuit of the sense amplifier circuit refers to the cross-coupled inverters (P2, N2, P3, N3) and the enable transistors P1 and N1.

The pass gates N4 and N5 are controlled by a control signal CX (node 28). In operation, the control signal CX is a delayed signal of the sense amplifier enable signal SAE and is used to disconnect the bit lines BL, BLb from the first and second terminals 52, 54 of the sense circuit a given delay after the sense amplifier enable signal is asserted. In other words, the bit lines BL, BLb are connected to the sense circuit for a brief duration after the sense amplifier enable signal SAE is asserted and the bit lines BL, BLb are then disconnected or isolated from the sense circuit. In this manner, the bit lines BL, BLb no longer experience the read current or the read voltage and disturbance of stored memory data is avoided. In one example, the inverted sense amplifier enable signal CB (node 28) is used as the control signal CX for the pass gates N5 and N5.

The sense amplifier circuit 50 requires well controlled timing to be applied to the pass gate N4 and N5 for the sense amplifier circuit to function correctly. Referring to FIG. 5, in one example, the control signal CX (curve 105) is the inverted enable signal CB. In that case, the pass gates N4 and N5 are cut off from the sense circuit early on, before the delayed sense amplifier enable signal SAEd is asserted. As can be observed from FIG. 5, when the bit lines BL, BLb (curve 108) are disconnected from the sense circuit when the control signal CX is deasserted (indicated by line 130), the bit lines experience very low current and voltage and read disturb is avoided. However, when the bit lines are disconnected too early, there may or may not be enough bit line signals yet for the sense circuit to determine the read data value.

In another example, if the control signal CX (curve 105) is extended, such as at line 132, then the read current and read voltage on the bit lines BL, BLb may be held for a long duration, the read cycle time may increase and furthermore, read disturb may result.

The sense amplifier circuit 50 requires the timing control signal to be well controlled in order for the circuit to work properly while also preventing read disturb. If the bit lines are connected to the sense amplifier for too short a duration, then the sense amplifier may read the wrong data as there is not enough read margin for the sense amplifier. On the other hand, if the bit lines are connected to the sense amplifier for too long a duration, then read disturb may result. It is often difficult to ensure the timing control is precise enough to make the sense amplifier circuit 50 work robustly, especially over process, temperature and voltage variations.

Figure 6:
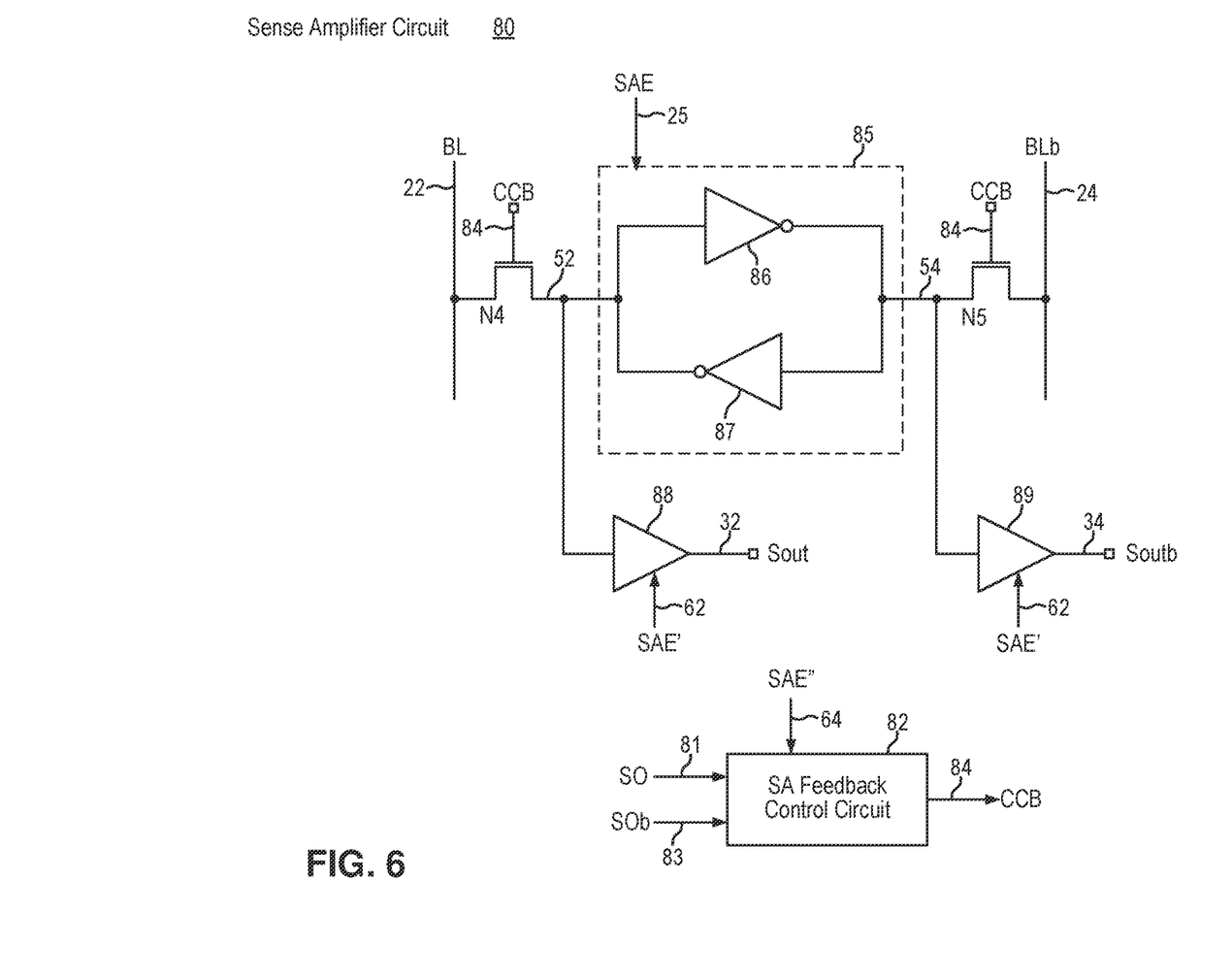
FIG. 6 is a circuit diagram illustrating a current sensing sense amplifier incorporating a self-timed sense amplifier feedback control scheme in embodiments of the present disclosure.

FIG. 6 is a circuit diagram illustrating a current sensing sense amplifier incorporating a self-timed sense amplifier feedback control scheme in embodiments of the present disclosure. Referring to FIG. 6, a sense amplifier circuit 80 incorporates a self-timed sense amplifier feedback control to prevent read disturb while ensuring robust circuit operation. In the present embodiment, the sense amplifier circuit 80 includes a sense circuit 85 formed by a pair of cross-coupled inverters 86 and 87. The sense circuit 85 may be activated by a sense amplifier enable signal SAE (node 25) to begin sensing and to terminate sensing. A first terminal 52 of the sense circuit 85 is coupled to the bit line BL (node 22) through a pass gate N4. A second terminal 54 of the sense circuit 85 is coupled to the bit line BLb (node 24) through a pass gate N5. The pass gates N4 and N5 are controlled by the control signal CCB (node 84) to either connect or isolate the bit lines BL/BLb to or from the sense circuit 85.

The sense amplifier circuit 80 includes a first output circuit 88 coupled to receive a sensed signal on the first terminal 52 and to generate the sense amplifier output signal Sout (node 32). The sense amplifier circuit 80 includes a second output circuit 89 coupled to receive a sensed signal on the second terminal 54 and to generate the sense amplifier output signal Soutb (node 34). The first and second output circuits 88 and 89 may be gated by a signal SAE' (node 62) related to the sense amplifier enable signal SAE to activate or deactivate the output circuits.

In embodiment of the present disclosure, the sense amplifier circuit 80 includes a sense amplifier feedback control circuit 82 to implement the self-timed sense amplifier feedback control scheme. The sense amplifier feedback control circuit 82 receives a first input signal SO (node 81) and a second input signal SOb (node 83). The signals SO and Sob are differential signals and are related to the sensed signals at the first and second terminals 52, 54 of the sense circuit 85 or are related to the sense amplifier output signals Sout and Soutb. In some embodiments, the sense amplifier feedback control circuit 82 may be gated by a signal SAE" (node 64) related to the sense amplifier enable signal SAE to activate or deactivate the feedback control circuit.

The sense amplifier feedback control circuit 82 operates to prevent read disturb issues while ensuring robust read operation by first letting the sense circuit sense the read data and then disconnect the differential bit lines from the sense circuit. In this manner, the sense amplifier circuit 80 is ensured of reading the correct data from the bit lines while disconnecting the bit lines from the sense circuit before read disturb can occur.

In one embodiment, the control signal CCB is asserted in an initial state to turn on or close the pass gates N4 and N5. During the read operation, the sense amplifier feedback control circuit 82 detects one of the input signals SO or SOb changing logical state, indicating the sense circuit has sensed the read data. The sense amplifier feedback control circuit 82 then deasserts the control signal CCB to turn off or open the pass gates N4 and N5. In this manner, the bit lines BL and BLb are disconnected from the sense circuit 85 to avoid read disturb. Meanwhile, the output circuits 88 and 89 provide the sense amplifier output signals Sout and Soutb.

In one embodiment, the sense amplifier feedback control circuit 82 is activated by the signal SAE" to start detecting the input signals. In some embodiments, the signal SAE" is a signal related to the sense amplifier enable signal SAE. For example, the signal SAE" may be a slightly delayed signal of the enable signal SAE.

The sense amplifier circuit 80 is effective in preventing read disturb. Although the bit lines may experience some amount of read current or read voltage, the read current/voltage is not high enough to cause read disturb. Meanwhile, by using the self-timed feedback control scheme, the operation of the sense amplifier circuit 80 does not require precision timing. Rather, whenever the sense circuit senses or detects the read data, the sense amplifier circuit then disconnects the bit lines from the sense circuit.

Figure 7:
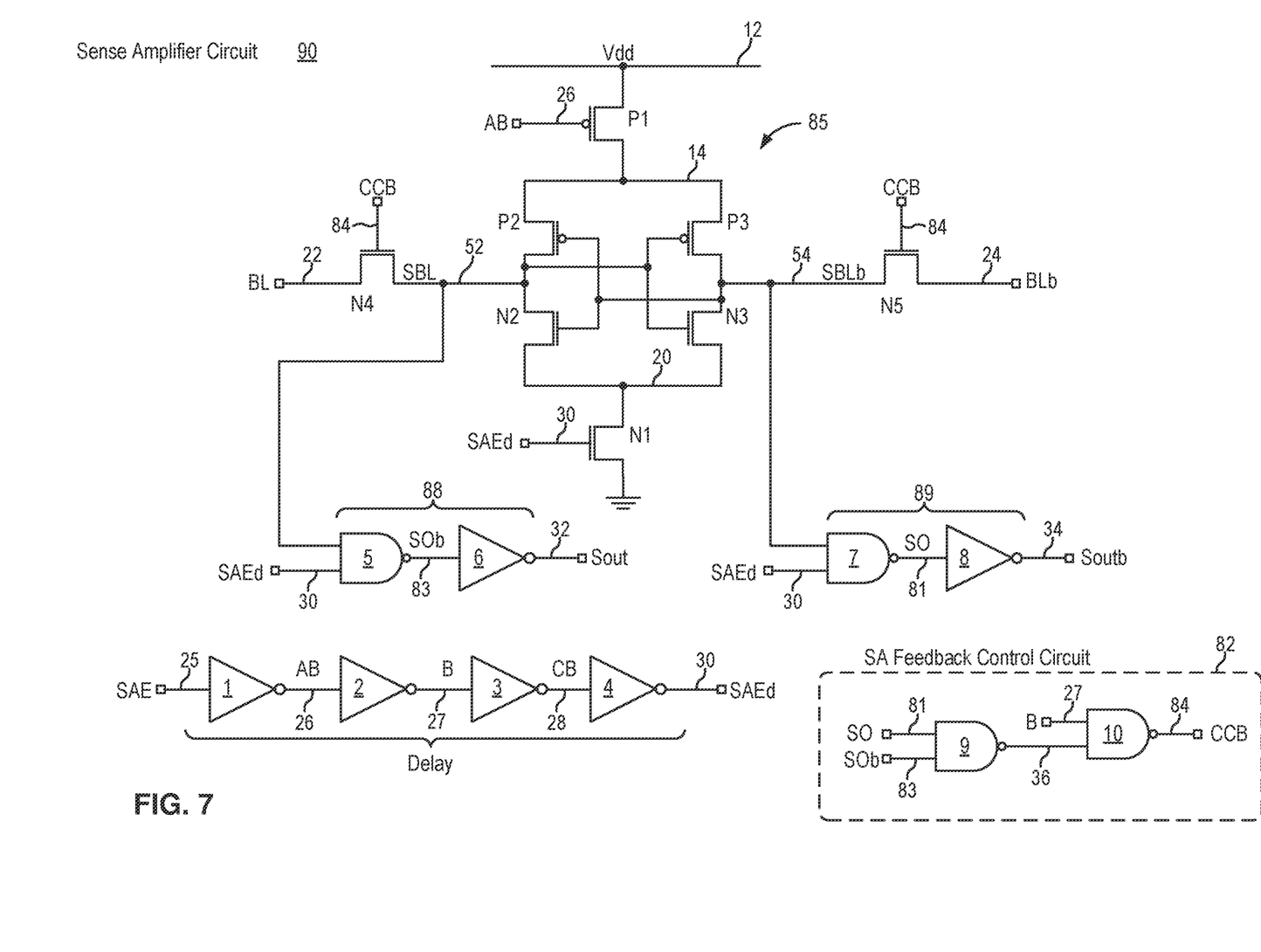
FIG. 7 is a circuit diagram illustrating a current sensing sense amplifier incorporating the self-timed feedback control scheme in embodiments of the present disclosure.
Figure 8:
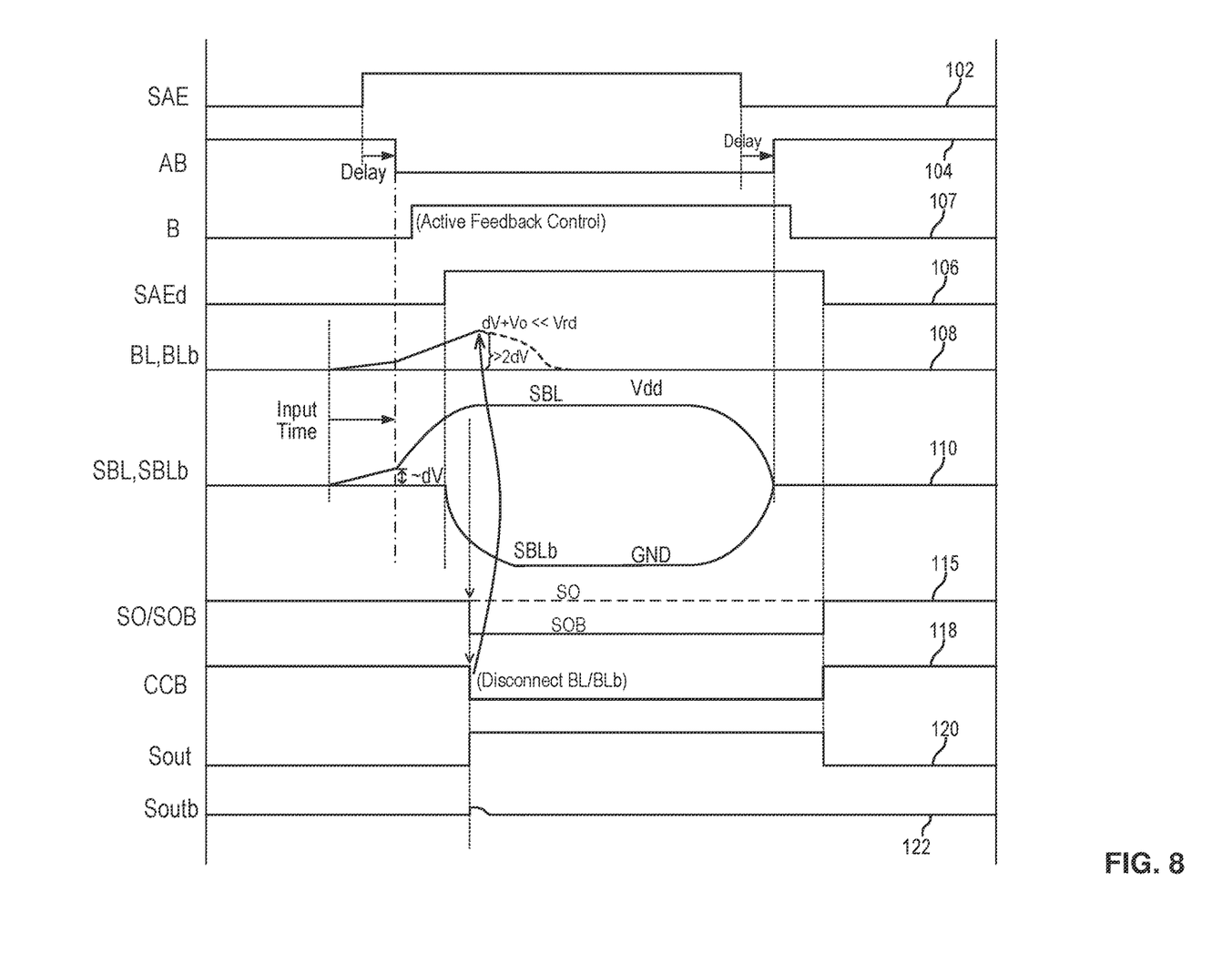
FIG. 8 is a timing diagram illustrating the operation of the sense amplifier circuit of FIG. 7 in some embodiments.

FIG. 7 is a circuit diagram illustrating a current sensing sense amplifier incorporating the self-timed feedback control scheme in embodiments of the present disclosure. FIG. 8 is a timing diagram illustrating the operation of the sense amplifier circuit of FIG. 7 in some embodiments. Like elements in FIGS. 2 to 8 are given like reference numerals to simplify the discussion. Referring to FIG. 7, a sense amplifier circuit 90 implementing current sensing for a pair of differential bit lines BL (node 22) and BLb (node 24) includes a sense circuit 85 formed by a pair of cross-coupled inverters. In particular, the sense circuit 85 includes a first inverter formed by PMOS transistor P2 and NMOS transistor N2 connected in series between a node 14 and a node 20. The sense circuit 85 further includes a second inverter formed by PMOS transistor P3 and NMOS transistor N3 connected in series between the node 14 and the node 20. A first terminal 52 of the sense circuit 85 is the output node of the first inverter and is also coupled to the input node of the second inverter. A second terminal 54 of the sense circuit 85 is the output node of the second inverter and is also coupled to the input node of the first inverter.

The sense circuit 85 is enabled by a sense amplifier enable signal SAE (node 25) to begin sensing and to terminate sensing. The sense amplifier enable signal SAE may be buffered by a chain of inverters 1-4. An inverted sense amplifier enable signal AB (node 26) is coupled to control a PMOS transistor P1 connected between the power supply voltage Vdd (node 12) and the node 14. A non-inverted sense amplifier enable signal SAEd (node 30) is coupled to control a CMOS transistor N1 connected between the node 20 and the ground potential. In the present illustration, the sense amplifier enable signal SAEd is a delayed version of the sense amplifier enable signal SAE. In this manner, when the PMOS transistor P1 and the NMOS transistor N1 are turned on by the respective sense amplifier enable signals AB and SAEd, the sense circuit 85 is activated to start sensing.

A pass gate N4 is connected between the bit line BL (node 22) and the first terminal 52 of the sense circuit 85. A pass gate N5 is connected between the bit line BLb (node 24) and the second terminal 54 of the sense circuit 85. Bit lines BL and BLb being differential bit lines carry differential bit line signals. That is, bit line BL carries a bit line signal and the bit line BLb carries the complement of the bit line signal. The pass gates N4 and N5 are controlled by the control signal CCB (node 84) to either connect or isolate the bit lines BL/BLb to or from the sense circuit 85.

The sense amplifier circuit 90 includes a first output circuit 88 coupled to receive a sensed signal SBL on the first terminal 52 and to generate the sense amplifier output signal Sout (node 32). In the present embodiment, the first output circuit 88 includes The sense amplifier circuit 90 includes output circuits to generate the sense amplifier output signals in response to the sensed signals at the sense circuit 85. In the present embodiment, the sense amplifier circuit 90 includes a first output circuit 88 coupled to receive a sensed signal SBL on the first terminal 52 and to generate the sense amplifier output signal Sout (node 32). The first output circuit 88 includes a NAND gate 5 connected to an inverter 6. The NAND gate 5 receives a first input signal being the sensed signal SBL from the first terminal 52 of the sense circuit and a second input signal being the enable signal SAEd (node 30). When activated by the enable signal SAEd, the NAND gate 5 pass the logical state of the sensed signal SBL on node 52 to the inverter 6 and inverter 6 generates the sense amplifier output signal Sout (node 32). The sense amplifier circuit 90 includes a second output circuit 89 coupled to receive a sensed signal SBLb on the second terminal 54 and to generate the sense amplifier output signal Soutb (node 34). The second output circuit 89 includes a NAND gate 7 connected to an inverter 8. The NAND gate 7 receives a first input signal being the sensed signal SBLb from the second terminal 54 of the sense circuit and a second input signal being the enable signal SAEd (node 30). When activated by the enable signal SAEd, the NAND gate 7 pass the logical state of the sensed signal SBLb on node 54 to the inverter 8 and inverter 8 generates the sense amplifier output signal Soutb (node 32). Sense amplifier output signal Soutb is a complement of the sense amplifier output signal Sout.

In embodiment of the present disclosure, the sense amplifier circuit 90 includes a sense amplifier feedback control circuit 82 to implement the self-timed sense amplifier feedback control scheme. The sense amplifier feedback control circuit 82 includes a NAND gate 9 receiving a first input signal SO (node 81) and a second input signal SOb (node 83). The signals SO and Sob are differential signals and are related to the sensed signals SBL and SBLb at the first and second terminals 52, 54 of the sense circuit 85 or are related to the sense amplifier output signals Sout and Soutb. In the present embodiment, the signal SO is an intermediate signal in the second output circuit 89. In particular, the signal SO is the output of the NAND gate 7 in the second output circuit 89 which is an inverse of the sensed signal SBLb at the second terminal 54. Furthermore, in the present embodiment, the signal SOb is an intermediate signal in the first output circuit 88. In particular, the signal SOb is the output of the NAND gate 5 in the first output circuit 88 which is an inverse of the sensed signal SBL at the second terminal 52.

In operation, the sensed signals SBL and SBLb have initial states of logical low ("0") and the signals SO and SOb have initial states of logical high ("1"). The NAND gate 9 thus has an output signal (node 36) at a logical low ("0") as the initial state. During the read operation, one of the sensed signals SBL and SBLb will be driven by the respective bit line to change logical state, which will result in one of the signals SO and SOb changing logical states. NAND gate 9 detects the change in logical state in one of its input signals (SO or SOb) and asserts the output signal (node 36) to a logical high ("1").

In the present embodiment, the sense amplifier feedback control circuit 82 is further gated by a signal B (node 27) related to the sense amplifier enable signal SAE (node 25) to activate or deactivate the feedback control circuit 82. In particular, the signal B is generated from the sense amplifier enable signal SAE (node 25) and may be a buffered or delayed version of the sense amplifier enable signal SAE (node 25). The sense amplifier feedback control circuit 82 further includes a NAND gate 10 to receive the output signal (Node 36) of the NAND gate 9 and the signal B. The NAND gate 10 generates an output signal (node 84) being the control signal CCB. In an initial state, the NAND gate 10 generates the output signal having a logical state high ("1") because the signal B is not yet asserted (logical low) and the NAND gate 9 output signal (node 36) also has an initial state of logical low ("0"). The control signal CCB having a logical state high will turn on or close the pass gates N4 and N5, enabling the sense circuit 85 to sense the signal being developed on the differential bit lines.

During the read operation, the signal B is asserted to a logical high ("1") in response to the sense amplifier enable signal SAE. Accordingly, the sense amplifier feedback control circuit 82 is ready to detect changes in the input signals SO (node 81) and SOb (node 83). In response to one of the signals SO or SOb changing logical state, the NAND gate 10 transitions the output signal to a logical low ("0"). As a result, the control signal CCB has a logical low state to turn off or open the pass gates N4 and N5. In this manner, the differential bit lines are disconnected from the sense amplifier circuit 90 after the sense amplifier senses the stored memory data on the bit lines. Importantly, the sense amplifier circuit 90 is able to disconnect the bit lines at the right time to prevent read disturb without using complex control circuit or precise timing.

Referring to FIG. 8, the operation of the sense amplifier circuit 90 in illustrated in one example. In the initial state, the control signal CCB is at a logical high and the differential bit lines BL and BLb are connected to the first and second terminals of the sense circuit through the pass gates N4 and N5. Therefore, in the initial state, the differential bit lines BL, BLb (curve 108) and the signals SBL, SBLb (curve 110) are at the same logical level of logical low, which can be the ground voltage or some other voltage potential. In the initial state, the sense amplifier enable signal (curve 102) is deasserted (logical low) and the related signals AB (curve 104), B (curve 107), and SAEd (curve 106) are also deasserted at their respective logical levels.

During the read operation, a memory cell is selected and the memory cell current, indicative of the stored memory data, flows into the differential bit lines BL and BLb. Bit line signals are developed on the bit lines BL and BLb. The sense amplifier circuit is activated when the sense amplifier enable signal SAE is asserted to a logical high level. At this time, the control signal CCB is still maintained at a logical high level to keep the bit lines connected due to the initial state of the SO and SOb signals (curve 115). The sense circuit starts to sense the bit line signals when the enable signals AB and SAEd are asserted after some delay. Furthermore, the sense amplifier feedback control circuit is activated to detect sensed signal changing states by the enable signal B being asserted (curve 108).

When the sensed signals SBL and SBLb sense the differential bit lines sufficiently to generate an output level, one of the sensed signal goes to logical high or low and the other sensed signal has the complement signal level. In the present example, the stored memory data is logical high and the sensed signal SBL is driven to the power supply voltage while the sensed signal SBLb is driven to the ground potential. The first or second output circuit is triggered by one of the sensed signal SBL or SBLb to change logical state. For example, in response to the sensed signal SBL, the NAND gate 5 causes the output SOb to switch logical state to logical low (curve 115). The first and second output circuits further generates the sense amplifier output signals Sout (curve 120) and Soutb (curve 122) in response to the sensed signals SBL and SBLb.

The sense amplifier feedback control circuit 82 detects the changing of logical state on sensed signal SOB and the NAND gate 9 changes the output signal to logical high. With the output of NAND gate 9 and the enable signal B both at logical high, the sense amplifier feedback control circuit 82 transitions the control signal CCB (curve 118) to a logical low, thereby disabling or turning off the pass gates N4 and N5. The bit lines BL and BLb are therefore disconnected from the sense amplifier circuit and read disturb conditions are avoided.

As thus configured, with the sense amplifier feedback control circuit activated by the enable signal B, when a change in logical state is sensed on the signals SO or SOb, the sense amplifier feedback control circuit will be triggered to deassert the control signal CCB to shut off the pass gates N4 and N5, thereby isolating the differential bit lines BL and BLb from the sense amplifier circuit.

As thus operated, the sense amplifier circuit 90 will see a small increase in the bit line voltages but the bit line voltages will not reach the read disturb level. Meanwhile, the sense amplifier circuit 90 can retain other important performance parameters, such as read cycle time, which is not achievable by prior solutions. For instance, the sense scheme of the present disclosure using self-timed feedback control is a key method to eliminate the read disturbance issue of quantum mechanical failures. Furthermore, the sense amplifier circuit improves the read endurance and stability of emerging memory devices, such as MRAM.

Figure 9:
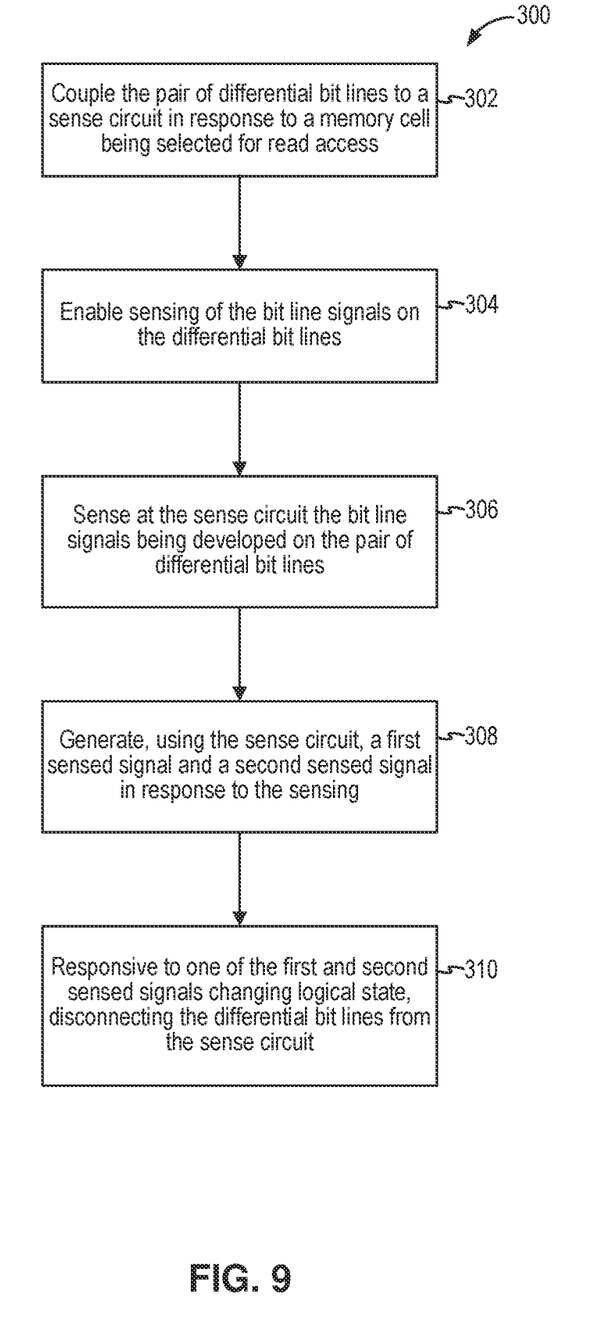
FIG. 9 is a flowchart illustrating a method of sensing bit line signals on a pair of differential bit lines in embodiments of the present disclosure.

FIG. 9 is a flowchart illustrating a method of sensing bit line signals on a pair of differential bit lines in embodiments of the present disclosure. Referring to FIG. 9, a method 300 senses bit line signals on a pair of differential bit lines coupled to a memory cell in a memory array. At 302, the method 300 couples the pair of differential bit lines to a sense circuit in response to a memory cell being selected for read access. At 304, the method 300 enables sensing of the bit line signals on the differential bit lines including a first bit line and a second bit line. At 306, the method 300 senses at the sense circuit the bit line signals being developed on the pair of differential bit lines in response to the sensing being enabled. At 308, the method 300 generates, using the sense circuit, a first sensed signal and a second sensed signal, complementary to the first sensed signal, in response to the sensing. At 310, the method 300 disconnects the first and second bit lines of the pair of differential bit lines from the sense circuit in response to one of the first and second sensed signals changing logical state.

In the above described embodiments, the sense amplifier circuit is configured for differential bit line configurations. In other embodiments, the sense amplifier circuit of the present disclosure can be configured for single ended bit lines.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided above along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A sense amplifier circuit for sensing bit line signals on a pair of differential bit lines, comprising:
   a first pass gate coupled between a first bit line of the pair of differential bit lines and a first node, the first pass gate being controlled by a first control signal;
   a second pass gate coupled between a second bit line of the pair of differential bit lines and a second node, the first bit line carrying a bit line signal and the second bit line carrying a complement of the bit line signal of the first bit line, the second pass gate being controlled by the first control signal;
   a sense circuit having a first terminal coupled to the first node and a second terminal coupled to the second node to sense the bit line signal and the complement bit line signal and to drive each of the first and second terminals in response to a sensed signal at the other one of the first and second terminals;
   a feedback control circuit coupled to receive a first signal indicative of a first sensed signal at the first terminal and a second signal indicative of a second sensed signal at the second terminal and to generate the first control signal in response to at least one of the first and second signals,
   wherein the feedback control circuit asserts the first control signal to a first logical state as an initial state to close the first and second pass gates, and the feedback control circuit deasserts the first control signal to a second logical state to open the first and second pass gates in response to at least one of the first and second signals changing logical state, the first and second pass gates being opened to disconnect the pair of differential bit lines from the first and second terminals of the sense circuit.

2. The sense amplifier circuit of claim 1, wherein the sense circuit generates the first and second sensed signals indicative of the bit line signal and the complement bit line signal carried on the pair of differential bit line, the sense circuit further comprising:
   a first logic circuit coupled to the first terminal to receive the first sensed signal and to generate a first sense amplifier output signal; and
   a second logic circuit coupled to the second terminal to receive the second sensed signal and to generate a second sense amplifier output signal, the first and second sense amplifier output signals being differential signals indicative of the bit line signals on the pair of differential bit lines.

3. The sense amplifier circuit of claim 2, wherein the feedback control circuit receives a first intermediate signal in the first logic circuit as the first signal and a second intermediate signal in the second logic circuit as the second signal.

4. The sense amplifier circuit of claim 1, wherein the sense circuit is enabled in response to an enable signal to sense the bit line signal and the complement bit line signal, and the feedback control circuit is activated by a signal indicative of the enable signal to detect the first and second signals changing states.

5. The sense amplifier circuit of claim 4, wherein the sense circuit comprises a cross-coupled inverter circuit including a first inverter and a second inverter, the first inverter having an input terminal coupled to the first terminal and an output terminal coupled to the second terminal, and the second inverter having an input terminal coupled to the second terminal and an output terminal coupled to the first terminal, the cross-coupled inverter circuit being enabled by the enable signal to sense the bit line signal and the complement bit line signal on the first and second terminal.

6. The sense amplifier circuit of claim 5, wherein the sense circuit generates the first and second sensed signals indicative of the bit line signal and the complement bit line signal carried on the pair of differential bit line, the sense circuit further comprising:
   a first logic circuit coupled to the first terminal to receive the first sensed signal and to generate a first sense amplifier output signal in response to a signal indicative of the enable signal; and
   a second logic circuit coupled to the second terminal to receive the second sensed signal and to generate a second sense amplifier output signal in response to a signal indicative of the enable signal, the first and second sense amplifier output signals being differential signals indicative of the bit line signals on the pair of differential bit lines.

7. The sense amplifier circuit of claim 6, wherein the feedback control circuit comprises:
   a third logic circuit coupled to receive the first signal and the second signal and further to receive a third signal indicative of the enable signal,
   wherein in response to the third signal being asserted to activate the feedback control circuit, the third logic circuit detects at least one of the first signal and the second signal changing logical state and generates the first control signal having the second logical state.

8. The sense amplifier circuit of claim 7, wherein the third logic circuit comprises:
   a first logical NAND gate coupled to receive the first signal and the second signal and to generate a first output signal, the first and second signals being inverse of the first and second sensed signals respectively; and
   a second logical NAND gate coupled to receive the first output signal and the third signal and to generate the first control signal.

9. The sense amplifier circuit of claim 1, wherein the differential bit lines are coupled to one or more memory cells in a memory array.

10. A method of sensing bit line signals on a pair of differential bit lines coupled to a memory cell in a memory array, comprising:
    in response to a memory cell being selected for read access, coupling first and second bit lines of the pair of differential bit lines to respective first and second terminals and enabling sensing of the bit line signals on the first and second bit lines;
    in response to the enabling, sensing at the first and second terminals the bit line signals being developed on the first and second bit lines of the pair of differential bit lines;
    generating a first sensed signal and a second sensed signal, complementary to the first sensed signal, in response to the sensing; and
    in response to one of the first and second sensed signals changing logical state, disconnecting the first and second bit lines from the respective first and second terminals.

11. The method of claim 10, wherein coupling first and second bit lines of the pair of differential bit lines to respective first and second terminals comprises:
    coupling first and second bit lines of the pair of differential bit lines to respective first and second terminals through respective first and second pass gates.

12. The method of claim 11, wherein disconnecting the first and second bit lines from the respective first and second terminals comprises:
- disabling the first and second pass gates to disconnect the first and second bit lines from the respective first and second terminals.

13. The method of claim 12, further comprising:
- generating a control signal having a first logical state as an initial state to enable the first and second pass gates:
- in response to the enabling, detecting the first and second sensed signals changing logical states; and
- in response to the detecting, generating the control signal having a second logical state to disable the first and second pass gates.

* * * * *